(12) United States Patent
Tanaka et al.

(10) Patent No.: US 8,715,420 B2
(45) Date of Patent: May 6, 2014

(54) METHOD FOR SUPPLYING HYDROXYL RADICAL-CONTAINING WATER AND APPARATUS FOR SUPPLYING HYDROXYL RADICAL-CONTAINING WATER

(75) Inventors: Tadaharu Tanaka, Osaka (JP); Motonobu Shiomi, Osaka (JP); Akihiro Ueno, Osaka (JP)

(73) Assignee: Kurashiki Boseki Kabushiki Kaisha, Okyama (JP)

( * ) Notice: Subject to any disclaimer, the term of this patent is extended or adjusted under 35 U.S.C. 154(b) by 176 days.

(21) Appl. No.: 13/376,165

(22) PCT Filed: Jun. 1, 2010

(86) PCT No.: PCT/JP2010/059258
§ 371 (c)(1),
(2), (4) Date: Dec. 2, 2011

(87) PCT Pub. No.: WO2010/140581
PCT Pub. Date: Dec. 9, 2010

(65) Prior Publication Data
US 2012/0094887 A1 Apr. 19, 2012

(30) Foreign Application Priority Data

Jun. 3, 2009 (JP) ................................. 2009-134231
Sep. 24, 2009 (JP) ................................. 2009-219178
Mar. 2, 2010 (JP) ................................. 2010-045453

(51) Int. Cl.
| | | |
|---|---|---|
| C02F 1/461 | (2006.01) | |
| B08B 17/00 | (2006.01) | |
| C11D 11/00 | (2006.01) | |
| C02F 1/78 | (2006.01) | |

(52) U.S. Cl.
CPC ........... *B08B 17/00* (2013.01); *B08B 2203/005* (2013.01); *C11D 11/0047* (2013.01); *C02F 1/78* (2013.01)

USPC ............................................... 134/2

(58) Field of Classification Search
CPC .. B08B 17/00; B08B 2203/005; B08B 13/04; C11D 11/0047; C02F 1/78
USPC .......................................................... 134/2
See application file for complete search history.

(56) References Cited

U.S. PATENT DOCUMENTS 6,080,531 A * 6/2000 Carter et al. ................ 430/329
6,383,724 B1 * 5/2002 Carter et al. ................ 430/329

(Continued)

FOREIGN PATENT DOCUMENTS

CN 1938829 A 3/2007
JP 4-179225 A 6/1992

(Continued)

OTHER PUBLICATIONS

International Preliminary Report on Patentability dated Dec. 22, 2011.

(Continued)

*Primary Examiner* — Gregory Webb
(74) *Attorney, Agent, or Firm* — Knobbe Martens Olson & Bear LLP

(57) ABSTRACT

Disclosed is a method for supplying hydroxyl radical-containing water, which is highly convenient and with which water containing a relatively high concentration of hydroxyl radicals can be supplied to the point of use. The method for supplying hydroxyl radical-containing water comprises a production step of producing hydroxyl radical-containing water by dissolving ozone, hydrogen peroxide, and at least one additive substance selected from a group consisting of a water-soluble organic compound, an inorganic acid, a salt of an inorganic acid, and hydrazine in pure water, a transferring step of transferring the produced hydroxyl radical-containing water to the point of use, and a supplying step of supplying the hydroxyl radical-containing water to the point of use after transferring.

16 Claims, 2 Drawing Sheets

(56) References Cited

U.S. PATENT DOCUMENTS

| | | | |
|---|---|---|---|
| 2002/0157686 A1* | 10/2002 | Kenny et al. | 134/1.3 |
| 2005/0045202 A1* | 3/2005 | Huang | 134/2 |
| 2005/0260107 A1* | 11/2005 | Jackson et al. | 422/136 |
| 2006/0084260 A1* | 4/2006 | Boyers et al. | 438/618 |
| 2010/0122713 A1* | 5/2010 | Tanaka et al. | 134/26 |

FOREIGN PATENT DOCUMENTS

| | | |
|---|---|---|
| JP | 5-291221 A | 11/1993 |
| JP | 2000-37695 A | 2/2000 |
| JP | 2001-054767 A | 2/2001 |
| JP | 2002-192089 A | 7/2002 |
| JP | 2005-294377 A | 10/2005 |
| JP | 2007-326096 A | 12/2007 |

OTHER PUBLICATIONS

Office Action issued Nov. 15, 2012 in corresponding Chinese patent application No. 201080024514.0.

Decision of Rejection issued May 31, 2013 in corresponding Chinese Patent Application No. 201080024514.0.

* cited by examiner

✳: 0 μmol/L

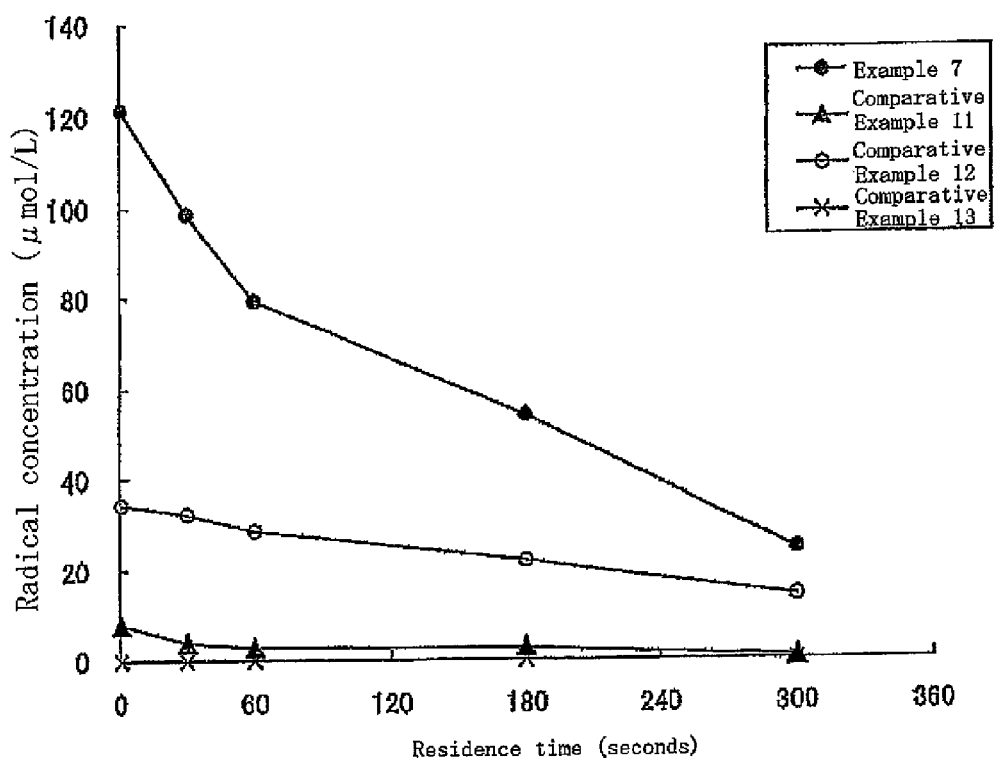

METHOD FOR SUPPLYING HYDROXYL RADICAL-CONTAINING WATER AND APPARATUS FOR SUPPLYING HYDROXYL RADICAL-CONTAINING WATER

CROSS-REFERENCE TO RELATED APPLICATIONS

This application is the U.S. National Phase under 35. U.S.C. §371 of International Application PCT/JP2010/059258, filed Jun. 1, 2010, which claims priority to Japanese Patent Application No. 2009-134231, filed Jun. 3, 2009, Japanese Patent Application No. 2009-219178, filed Sep. 24, 2009, and Japanese Patent Application No. 2010-045453, filed Mar. 2, 2010. The International Application was published under PCT Article 21(2) in a language other than English.

TECHNICAL FIELD

The invention relates to a method for supplying hydroxyl radical-containing water and an apparatus for supplying hydroxyl radical-containing water.

BACKGROUND ART

Among active oxygen species, hydroxyl radicals have very strong oxidizing properties and can react with a very wide variety of organic compounds (contaminants). Therefore, hydroxyl radical-containing water is known to be useful as a cleaning liquid for decomposing or removing TOC in ultra-pure water or decomposing or removing organic compounds deposited on the surface of a solid such as a wafer.

For example, Patent Document 1 discloses that hydroxyl radicals are produced in a cleaning method characterized by bringing an object to be cleaned into contact with ozone bubbles-containing water in the presence of a reducing substance.

Also for example, Patent Document 2 discloses that hydroxyl radicals are produced in a cleaning method characterized by including immersing an object to be cleaned in a liquid in which ozone is dissolved or bubbled, and applying ultraviolet light to the surface of the immersed object to clean the surface.

Conventionally, there has also been an ozone water supply method including transferring ozone water to the point of use in the presence of an ozone decomposition inhibitor, reducing the ozone concentration to a predetermined value at a place in the vicinity of the point of use by concentration control means, and then supplying the ozone water (see for example Patent Document 3). The concentration control means is means for decomposing dissolved ozone, examples of which include ultrasonic irradiation, ultraviolet irradiation, turbulence formation, agitation, heating, alkali addition, and hydrogen peroxide addition.

PRIOR ART DOCUMENTS

Patent Documents

Patent Document 1: Japanese Patent Application Laid-Open (JP-A) No. 2001-54767
Patent Document 2: JP-A No. 05-291221
Patent Document 3: JP-A No. 2005-294377

SUMMARY OF THE INVENTION

Problems to be Solved by the Invention

However, the method disclosed in Patent Document 1 or 2 produces a small amount of hydroxyl radicals, and therefore, there has been a demand for a method capable of producing hydroxyl radicals with relatively high efficiency. In particular, the method using ultraviolet light has a problem in that large-scale ultraviolet irradiation equipment or a strong ultraviolet lamp needs to be installed to generate a high concentration of hydroxyl radicals. The method of applying ultraviolet light directly to the surface of the object to be cleaned, as disclosed in Patent Document 2, has the problem of shadowed area formation.

In the ozone water supply method disclosed in Patent Document 3, an ozone decomposition inhibitor is added to prevent decomposition of ozone being transferred, which is not intended to produce hydroxyl radical-containing water in advance so that it can be transferred to and supplied at the point of use. It is considered that the placement of concentration control means at every point of use in the ozone water supply method disclosed in Patent Document 3 is based on the understanding that hydroxyl radicals cannot be transferred, even though they are produced in advance.

The present invention has been accomplished in view of the above problems, and an object of the invention is to provide a hydroxyl radical-containing water supply method and a hydroxyl radical-containing water supply apparatus each capable of simply supplying, to the point of use, water containing a relatively high concentration of hydroxyl radicals.

Means for Solving the Problems

As a result of earnest studies to achieve the object, the inventors have accomplished the invention based on the finding that when ozone, hydrogen peroxide, and a water-soluble organic substance or the like are dissolved in pure water, hydroxyl radicals can be produced with relatively high efficiency and that their concentration can be maintained for several minutes or so.

Specifically, the method of the invention for supplying hydroxyl radical-containing water is characterized by including: a production step including dissolving ozone, hydrogen peroxide, and at least one additive selected from the group consisting of a water-soluble organic substance, an inorganic acid, a salt of the inorganic acid, and hydrazine in pure water to produce hydroxyl radical-containing water; a transfer step including transferring the produced hydroxyl radical-containing water to a point of use; and a supply step including supplying the transferred hydroxyl radical-containing water at the point of use.

According to this feature, ozone, hydrogen peroxide, and at least one additive selected from the group consisting of a water-soluble organic substance, an inorganic acid, a salt of the inorganic acid, and hydrazine axe dissolve in pure water, so that hydroxyl radicals can be produced with relatively high efficiency. Therefore, water containing a high concentration of hydroxyl radicals can be simply produced with no need for large-scale equipment such as ultraviolet irradiation equipment. In addition, a reduction over time in the concentration of hydroxyl radicals is suppressed in the hydroxyl radical-containing water produced by dissolving ozone, hydrogen peroxide, and the additive in pure water. Therefore, the hydroxyl radical-containing water, in which a high concentration state is maintained, can be transferred to and supplied at the point of use. As used herein, the term "point of use" refers to a facility, an apparatus, a location, or any other place where the produced hydroxyl radical-containing water is used.

In general, ozone-containing water (including hydroxyl radical-containing water) is not produced at the point of use but produced at about one place per facility and then transferred to and supplied at points of use, which are present at different locations. According to the above feature, hydroxyl radical-containing water is produced before it is transferred to the point of use, and then it can be transferred while kept at a certain concentration. Therefore, hydroxyl radical-containing water does not have to be produced per each point of use, which makes it possible to integrate production sites into one, so that high convenience and a reduction in the production cost of hydroxyl radical-containing water can be achieved.

It should be noted that the ozone water supply method disclosed in Patent Document 3 controls the ozone concentration at the point of use. Therefore, the concentration control (for example, ultraviolet irradiation) is performed at a place as close as possible to the point of use. It is also considered that the desired ozone concentration should vary with the point of use, so that such concentrations are generally impossible to control at one place before the transfer to points of use. In contrast, the method of the invention can produce and supply water containing a high concentration of hydroxyl radicals and therefore makes it possible to produce hydroxyl radical-containing water at one place before the transfer to points of use and to transfer and supply it to points of use. As described above, the invention and the ozone water supply method disclosed in Patent Document 3 have clearly different features (processes) with respect to whether the desired product (hydroxyl radical-containing water in the invention or ozone water with a predetermined concentration in Patent Document 3) is obtained before or after it is transferred to the point of use. It should also be noted that in the first place, Patent Document 3 discloses an ozone water supply method and does not describe a method for supplying hydroxyl radical-containing water.

In the production step of the method, ozone, hydrogen peroxide, and the additive are preferably dissolved in a weight ratio of ozone/hydrogen peroxide/the additive of 10-40/10-40/1-4 to form the hydroxyl radical-containing water. When ozone, hydrogen peroxide, and the additive are dissolved in a weight ratio of ozone/hydrogen peroxide/the additive of 10-40/10-40/1-4, the transferred hydroxyl radicals can be supplied at a higher concentration.

In the method, the additive is preferably dissolved at 1 to 100 ppm.

In the method, the additive is preferably a water-soluble organic substance, and the water-soluble organic substance preferably has an ozone reaction rate constant of 10 L/mol/sec or less. The ozone reaction rate constant is the rate constant of reaction with ozone, and the smaller rate constant means that the reaction with ozone is less likely to occur. When the water-soluble organic substance used has a relatively small ozone reaction rate constant, the water-soluble organic substance can contribute to the acceleration of the hydroxyl radical production reaction without inhibiting the production of hydroxyl radicals from ozone.

In the method, the water-soluble organic substance is preferably isopropanol.

In the method, the additive is preferably carbonic acid as the inorganic acid. When carbonic acid is used as the additive, it can be vaporized in the form of carbon dioxide after the hydroxyl radical-containing water is used.

In the method, pure water is preferably ultrapure water with an electrical resistivity of 17 MΩ·cm or more.

In the supply step of the method, the hydroxyl radical-containing water is preferably supplied as a cleaning liquid for an electronic component or as a cleaning liquid in a process of manufacturing an electronic component.

On the other hand, the apparatus of the present invention for supplying hydroxyl radical-containing water is characterized by including: production means for producing hydroxyl radical-containing water by dissolving ozone, hydrogen peroxide, and at least one additive selected from the group consisting of a water-soluble organic substance, an inorganic acid, a salt of the inorganic acid, and hydrazine in pure water; transfer means for transferring the produced hydroxyl radical-containing water to a point of use; and supply means for supplying the transferred hydroxyl radical-containing water at the point of use.

According to this feature, ozone, hydrogen peroxide, and at least one additive selected from the group consisting of a water-soluble organic substance, an inorganic acid, a salt of the inorganic acid, and hydrazine are dissolve in pure water, so that hydroxyl radicals can be produced with relatively high efficiency. Therefore, water containing a high concentration of hydroxyl radicals can be simply produced with no need for large-scale equipment such as ultraviolet irradiation equipment. In addition, a reduction over time in the concentration of hydroxyl radicals is suppressed in the hydroxyl radical-containing water produced by dissolving ozone, hydrogen peroxide, and the additive in pure water. Therefore, the hydroxyl radical-containing water, in which a high concentration state is maintained, can be transferred to and supplied at the point of use.

According to the above feature, hydroxyl radical-containing water is produced before it is transferred to the point of use, and then it is transferred. Therefore, hydroxyl radical-containing water does not have to be produced per each point of use, which makes it possible to integrate production sites into one, so that high convenience and a reduction in the production cost of hydroxyl radical-containing water can be achieved.

In the apparatus, the production means preferably dissolves ozone, hydrogen peroxide, and the additive in a weight ratio of ozone/hydrogen peroxide/the additive of 10-40/10-40/1-4. When ozone, hydrogen peroxide, and the additive are dissolved in a weight ratio of ozone/hydrogen peroxide/the additive of 10-40/10-40/1-4, hydroxyl radicals can be produced at a higher concentration.

In the apparatus, the production means preferably dissolves the additive at 1 to 100 ppm.

In the apparatus, the additive is preferably a water-soluble organic substance, and the water-soluble organic substance preferably has an ozone reaction rate constant of 10 L/mol/sec or less. When the water-soluble organic substance used has a relatively small ozone reaction rate constant, the water-soluble organic substance can contribute to the acceleration of the hydroxyl radical production reaction without inhibiting the production of hydroxyl radicals from ozone.

In the apparatus, the water-soluble organic substance is preferably isopropanol.

In the apparatus, the additive is preferably carbonic acid as the inorganic acid. When carbonic acid is used as the additive, it can be vaporized in the form of carbon dioxide after the hydroxyl radical-containing water is used.

In the apparatus, pure water is preferably ultrapure water with an electrical resistivity of 17 MΩ·cm or more.

In the apparatus, the supply means preferably supplies the hydroxyl radical-containing water as a cleaning liquid for an electronic component or as a cleaning liquid in a process of manufacturing an electronic component.

Effects of the Invention

The invention makes it possible to provide a hydroxyl radical-containing water supply method and a hydroxyl radical-containing water supply apparatus each capable of simply supplying, to the point of use, water containing a relatively high concentration of hydroxyl radicals.

BRIEF DESCRIPTION OF DRAWINGS

FIG. 3 is a graph showing the relationship between residence time and hydroxyl radical concentration.

EMBODIMENTS FOR CARRYING OUT THE INVENTION

Figure 1:
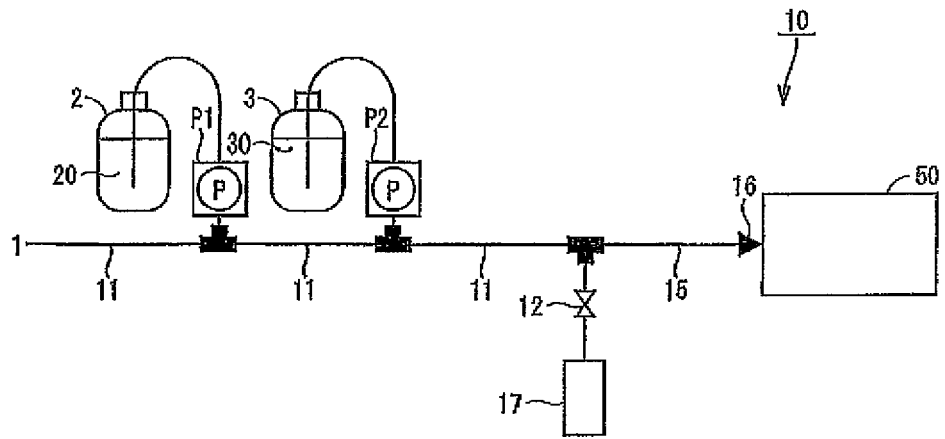
FIG. 1 is a schematic diagram of a hydroxyl radical-containing water supply apparatus according to one embodiment of the invention.

Hereinafter, embodiments of the invention will be described. It will be understood that the embodiments described below are not intended to limit the invention, and design changes may be made as appropriate within the scope of the invention.

First, a description is given of the hydroxyl radical-containing water according to the invention.

The hydroxyl radical-containing water (hereinafter also referred to as "radical water") is produced by dissolving, in pure water, ozone, hydrogen peroxide, and at least one additive selected from the group consisting of a water-soluble organic substance, an inorganic acid, a salt of the inorganic acid, and hydrazine. In an embodiment of the invention, hydroxyl radicals can be produced with relatively high efficiency only by dissolving ozone, hydrogen peroxide, and the additive in pure water even without using equipment such as ultraviolet irradiation equipment.

First, a description is given of a case where a water-soluble organic substance is used as the additive. It is considered that when ozone, hydrogen peroxide, and a water-soluble organic substance are present in water, hydroxyl radicals are produced according to the reaction formulae shown below.

First, hydroxyl radicals are produced from ozone and hydrogen peroxide (formula 1). Hydroxyl radicals, which have a short lifetime, quickly disappear, but in the presence of a water-soluble organic substance, hydroxyl radicals cause a chain reaction with the water-soluble organic substance (formula 2).

In addition, organic radicals (R.) produced by the chain reaction react with hydrogen peroxide to form hydroxyl radicals (formula 3).

Reaction Formulae:

Production of hydroxyl radicals by reaction of ozone with hydrogen peroxide (formula 1)

$$O_3 + H_2O_2 \rightarrow OH. + HO_2. + O_2$$

$$H_2O_2 \Leftrightarrow HO_2^- + H^+$$

$$O_3 + HO_2^- \rightarrow OH. + O_2^-. + O_2$$

Chain reaction with organic substance (formula 2)

$$RH + OH. \rightarrow R. + H_2O$$

$$R. + O_2 \rightarrow RO_2.$$

$$RO_2. + RH \rightarrow ROOH + R.$$

$$RO_2. + HO_2. \rightarrow RO. + O_2 + OH.$$

Production by decomposition of hydrogen peroxide (formula 3)

$$H_2O_2 + R. \rightarrow HOR + OH.$$

For the production of hydroxyl radicals, the water-soluble organic substance to be used should have an ozone reaction rate constant of 10 L/mol/sec or less, especially 1.0 L/mol/sec or less, preferably 0.001 to 1.0 L/mol/sec. The ozone reaction rate constant is the rate constant of reaction with ozone, and the smaller rate constant means that the reaction with ozone is less likely to occur. When the water-soluble organic substance used has a relatively small ozone reaction rate constant as stated above, the water-soluble organic substance can contribute to the acceleration of the hydroxyl radical production reaction without inhibiting the production of hydroxyl radicals from ozone. The ozone reaction rate constants of various compounds can be found in known publications and, for example, shown in Table 2.2 "Rate Constants of Reaction of Compounds with Ozone and OH Radical in Water" of "Ozone Treatment and Hydroxyl Radicals" (authored by NAKAYAMA Shigeki) published from The Fourth "Ozone/Radical Sterilization and Deodorization Workshop."

Examples of such a water-soluble organic substance include alcohols such as methanol, ethanol, n-propanol, iso-propanol, n-butanol, iso-butanol, and tert-butanol, acetone, acetic acid, formic acid, citric acid, etc.

For use of the radical water as a cleaning liquid for electronic components or the like, those having a relatively low boiling point are preferably used among the above water-soluble organic substances, and examples include n-propanol, iso-propanol, n-butanol, iso-butanol, and tert-butanol. The most preferred water-soluble organic substance is iso-propanol (isopropanol).

Next, a description is given of a case where an inorganic acid is used as the additive.

Examples of the inorganic acid or the inorganic acid salt include hydrochloric acid, sulfuric acid, carbonic acid, a carbonate, a hydrogencarbonate, nitrous acid, a nitrite, sulfurous acid, a sulfite, a hydrogensulfite, and hydrofluoric acid. In particular, carbonic acid is preferred, because it can be vaporized in the form of carbon dioxide after the radical water is used.

It is considered that when ozone, hydrogen peroxide, and carbonic acid are present in water, hydroxyl radicals are produced according to the reaction formulae shown below.

First, hydroxyl radicals are produced from ozone and hydrogen peroxide (formula 4). Hydroxyl radicals, which have a short lifetime, quickly disappear, but in the presence of a carbonic acid, hydroxyl radicals cause a chain reaction with carbonic acid (formula 5).

In addition, hydroperoxyl radicals (HO$_2$.) produced by the reaction between carbonic acid and hydrogen peroxide react with ozone to form hydroxyl radicals (formula 6).

Reaction Formulae:
Production of hydroxyl radicals by reaction of ozone with hydrogen peroxide (formula 4)

$$O_3 + H_2O_2 \rightarrow OH. + HO_2. + O_2$$

$$H_2O_2 \Leftrightarrow HO_2^- + H^+$$

$$O_3 + HO_2^- \rightarrow OH. + O_2^-. + O_2$$

Chain reaction with carbonic acid (formula 5)

$$CO_2 + H_2O \Leftrightarrow HCO_3^- + H^+$$

$$HCO_3^- \Leftrightarrow CO_3^{2-} + H^+$$

$$CO_3^{2-} + OH. \rightarrow CO_3^-. + OH^-$$

$$CO_3^-. + OH. \rightarrow CO_2 + HO_2^-$$

$$O_3 + HO_2^- \rightarrow OH. + O_2^-. + O_2$$

Production of hydroxyl radicals from ozone and hydroperoxyl radicals produced by the reaction between carbonic acid and hydrogen peroxide (formula 6)

$$CO_2 + H_2O \Leftrightarrow HCO_3^- + H^+$$

$$HCO_3^- \Leftrightarrow CO_3^{2-} + H^+$$

$$CO_3^{2-} + OH. \rightarrow CO_3^-. + OH^-$$

$$CO_3^-. + H_2O_2 \rightarrow HCO_3^- + HO_2.$$

$$HO_2. \Leftrightarrow +O_2^-. + H^+$$

$$O_2^-. + O_3 \rightarrow O_3—. + O_2$$

$$O_3^-. + H_2O \rightarrow OH. + O_2 + OH^-$$

Pure water to be used is generally water produced by removing impurities and having an electrical resistivity of 15 MΩ·cm or more. For use of the radical water as a cleaning liquid for components such as electronic components, semiconductor components, and liquid crystal-related components (hereinafter referred to as electronic components, etc.), ultrapure water with an electrical resistivity of 17 MΩ·cm or more is preferably used. The electrical resistivity may be measured using a commercial specific resistance meter.

Ozone, hydrogen peroxide, and the additive may be dissolved in any order in pure water, as long as these three components are added to the same system. At the point when ozone is mixed with hydrogen peroxide, ozone decomposition and radical production reaction occur, and radicals quickly disappear. Therefore, the additive is preferably added before ozone and hydrogen peroxide are mixed. For example, (1) ozone, the additive, and hydrogen peroxide may be added in this order to pure water to form a solution, (2) after ozone is dissolved in pure water, hydrogen peroxide and the additive may be simultaneously added and dissolved, (3) the additive, ozone, and hydrogen peroxide may be added in this order to pure water to form a solution, (4) the additive, hydrogen peroxide, and ozone may be added in this order to pure water to form a solution, (5) hydrogen peroxide, the additive, and ozone may be added in this order to pure water to form a solution, or (6) ozone, hydrogen peroxide, and the additive may be simultaneously added to pure water to form a solution. Ozone is less soluble than the other components (the low solubility of ozone), and ozone is quickly decomposed when dissolved in impurity-free water (the self-decomposability of ozone). From these points of view, the order (1) and the order (2) are preferably used. In particular, the order (1) is preferably used in view of the self-decomposability of ozone.

Ozone, hydrogen peroxide, and the additive may be added by any method. For example, ozone, hydrogen peroxide, and the additive may be each independently dissolved in pure water in advance, and added in the form of an aqueous solution, or may be added as they are at room temperature and atmospheric pressure. Particularly in view of the low solubility of ozone, it is preferred that ozone should be previously dissolved alone in pure water and used in the form of an aqueous solution. Hydrogen peroxide and the additive are each easily soluble in pure water, and their concentrations are easy to control. From these points of view, it is preferred that hydrogen peroxide and the additive should be each independently dissolved in pure water in advance and added in the form of an aqueous solution.

Ozone may be dissolved by any method capable of dissolving ozone in a solvent such as pure water or an aqueous solution. For example, ozone may be dissolved by a process including charging a solvent into an ozone dissolving device and supplying, into the device, ozone produced in an ozonizer. The ozonizer is a device for producing ozone from oxygen supplied from an oxygen cylinder, which is connected to the ozonizer. A known ozone generator may be used for the ozonizer, and examples include a general-purpose, water-cooled, ozone generator and a silent discharge-type ozone generator, which are commercially available from SUMITOMO PRECISION PRODUCTS Co., Ltd., REGAL JOINT CO., LTD., Ecodesign. Inc., or other companies.

In general, hydrogen peroxide and the additive can be easily dissolved in a solvent such as pure water or an aqueous solution only by adding each of them to the solvent at ordinary temperature.

FIG. 1 is a schematic diagram of a hydroxyl radical-containing water supply apparatus according to an embodiment of the invention.

As illustrated in FIG. 1, the hydroxy radical-containing water supply apparatus 10 (hereinafter also referred to as the radical water supply apparatus 10) includes: a pipe 11; an aqueous additive solution storage tank 2 and an aqueous hydrogen peroxide solution storage tank 3 each connected to the pipe 11; a transfer pipe 15 connected to a downstream portion of the pipe 11; and a supply unit 16 provided at the downstream side end of the transfer pipe 15.

Ozone water 1 is produced by previously dissolving ozone in pure water, and fed from the upstream side (left side in FIG. 1) to the downstream side (right side in FIG. 1) through the pipe 11. In this process, an aqueous additive solution 20 is first added by a pump P1 from the aqueous additive solution storage tank 2, which is connected to a relatively upstream portion, and then an aqueous hydrogen peroxide solution 30 is added by a pump P2 from the aqueous hydrogen peroxide solution storage tank 3. As a result, radical water 4 (not shown) is successfully obtained. The pipe 11, the pumps P1 and P2, the aqueous additive solution storage tank 2, the aqueous hydrogen peroxide solution storage tank 3, the aqueous additive solution 20, and the aqueous hydrogen peroxide solution 30 correspond to the production means in the invention. The step of adding the aqueous additive solution 20 and the aqueous hydrogen peroxide solution 30 to the ozone water 1 being transferred through the pipe 11 to obtain radical water 4 corresponds to the production step in the invention.

In the production of the radical water 4, ozone, hydrogen peroxide, and the additive are preferably dissolved in a weight ratio of ozone/hydrogen peroxide/the additive of 10-40/10-40/1-4/, more preferably 10-20/10-20/1-2. When ozone, hydrogen peroxide, and the additive are dissolved in a weight ratio of ozone/hydrogen peroxide/the additive of 10-40/10-40/1-4, a higher concentration of hydroxyl radicals can be produced.

The radical water 4 obtained as described above is transferred to the supply unit 16 through the transfer pipe 15, and the transferred radical water 4 is supplied to a cleaning tank 50 (corresponding to the point of use) through the supply unit 16. The transfer pipe 15 corresponds to the transfer means in the invention, and the supply unit 16 corresponds to the supply means in the invention. The step of transferring the radical water 4 to the supply unit 16 through the transfer pipe 15 corresponds to the transfer step in the invention, and the step of supplying the transferred radical water 4 to the cleaning tank 50 through the supply unit 16 corresponds to the supply step in the invention.

Part of the radical water 4 obtained as described above is transferred to a hydroxyl radical concentration meter 17, which is connected to the pipe 11 through a valve 12, and measured for hydroxyl radical concentration.

Ozone is generally dissolved in pure water at a concentration of 1 to 400 ppm, preferably 1 to 100 ppm.

As used herein, the ozone concentration is the value measured after the addition of ozone to pure water is completed and before hydrogen peroxide and the additive are added. For example, when the radical water is produced in the radical water supply apparatus 10 shown in FIG. 1, the ozone water is sampled and measured for ozone concentration before the additive is added. For example, the ozone concentration may be measured using an absorptiometer WATERLYZER (manufactured by KURABO INDUSTRIES LTD.), an in-line type dissolved ozone monitor (manufactured by EBARA JITSUGYO CO., LTD.), or the like.

The unit "ppm" indicates the weight ratio to the total weight.

The additive is preferably dissolved so that the concentration of the additive in the resulting radical water can be from 1 to 100 ppm, more preferably from 1 to 10 ppm.

In the description, the concentration of the additive is calculated from the added amount of the additive. For example, when the radical water is produced in the radical water supply apparatus 10 shown in FIG. 1, the additive concentration is calculated as the ratio of the added amount of the additive to the total amount of the radical water from the ratio between the flow rate of the ozone water 1, the flow rate of the liquid fed by the pump P1, and the flow rate of the liquid fed by the pump P2, based on the concentration of the aqueous water-soluble organic substance solution 20 in the aqueous addition solution storage tank 2.

The concentration of the aqueous additive solution 20 in the aqueous addition solution storage tank 2 is not restricted as long as the concentration of the additive in the whole radical water falls within the above range. In general, the aqueous additive solution 20 used has a concentration of 100 to 10,000 ppm, especially 100 to 1,000 ppm. The aqueous additive solution 20 having such a concentration may be added, to the ozone water 1, in such a ratio (amount) that the concentration of hydrogen peroxide in the whole radical water can be a predetermined value.

Hydrogen peroxide is generally dissolved so that the concentration of hydrogen peroxide in the resulting radical water can be from 1 to 400 ppm, preferably from 1 to 100 ppm.

In the description, the concentration of hydrogen peroxide is calculated from the added amount of hydrogen peroxide. For example, when the radical water is produced by the method shown in FIG. 1, the hydrogen peroxide concentration is calculated as the ratio of the added amount of hydrogen peroxide to the total amount of the radical water from the ratio between the flow rate of the ozone water 1, the flow rate of the liquid fed by the pump P1, and the flow rate of the liquid fed by the pump P2, based on the concentration of the aqueous hydrogen peroxide solution 30 in the aqueous hydrogen peroxide solution storage tank 3.

The concentration of the aqueous hydrogen peroxide solution 30 in the aqueous hydrogen peroxide solution storage tank 3 is not restricted as long as the concentration of hydrogen peroxide in the whole radical water falls within the above range. In general, the aqueous hydrogen peroxide solution 30 used has a concentration of 100 to 40,000 ppm, especially 100 to 30,000 ppm. The aqueous hydrogen peroxide solution 30 having such a concentration may be added, to the ozone water 1, in such a ratio (amount) that the concentration of hydrogen peroxide in the whole radical water can be a predetermined value. For efficient production of hydroxyl radicals, the hydrogen peroxide concentration is preferably from ½ to 3 times the ozone concentration when they are mixed.

The presence of hydroxyl radicals in the radical water produced by the above method can be checked by the method of measuring radical concentrations according to JIS R 1704: 2007.

According to the invention, a relatively high concentration of hydroxyl radicals can be achieved in the radical water, and for example, when the ozone concentration is about 90 ppm, the hydroxyl radical concentration is 90 µmol/L or more, preferably from 95 to 160 µmol/L.

As used herein, the hydroxyl radical concentration is the value measured 0.5 seconds after the addition of ozone, hydrogen peroxide, and the additive to pure water is completed. For example, when the radical water is obtained in the radical water supply apparatus 10 shown in FIG. 1, the radical water sampled 0.5 seconds after the aqueous hydrogen peroxide solution 30 is finally added is immediately used in the measurement of the hydroxyl radical concentration.

The hydroxyl radical concentration may be measured as described below according to JIS R 1704:2007. Specifically, to a 100 mL measuring flask is added 1 mL of DMSO (an aqueous dimethyl oxide solution) with a DMSO concentration of 5,000 ppm. Subsequently, 100 mL of the radical water immediately after the production is added to the measuring flask and stirred sufficiently so that DMSO is allowed to react with the hydroxyl radicals. The reaction follows the reaction formulae below. Therefore, the amount of methanesulfonic acid produced by the reaction is equal to the amount of DMSO and hydroxyl radicals allowed to react. Thus, the hydroxyl radical concentration can be calculated from the amount of the radical water subjected to the measurement and the measured value obtained by ion-chromatographic measurement of the amount of methanesulfonic acid produced by the reaction.

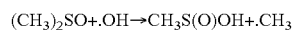

$(CH_3)_2SO + \cdot OH \rightarrow CH_3S(O)OH + \cdot CH_3$

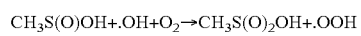

$CH_3S(O)OH + \cdot OH + O_2 \rightarrow CH_3S(O)_2OH + \cdot OOH$

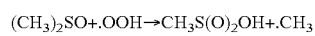

$(CH_3)_2SO + \cdot OOH \rightarrow CH_3S(O)_2OH + \cdot CH_3$

The radical water produced generally contains not only hydroxyl radicals but also residues of ozone, hydrogen peroxide, and the additive used as raw materials, and by-products of the production of hydroxyl radicals, such as by-products of the reactions represented by formulae 1 to 3 and 4 to 6 shown above.

In an embodiment of the invention, the hydroxyl radical-containing water may be subjected to pH adjustment, temperature adjustment, or concentration adjustment as needed so that its detergency can be adjusted or its cleaning selectivity can be enhanced. For example, in the field of semiconductor cleaning as described below, main cleaning targets are metals, organic substances, and particles. Specifically, for removal of particles, the pH should be shifted to the alkali side, so that a silicon substrate and particles can have the same polarity of zeta potentials, which makes it possible to perform lift-off cleaning efficiently. For removal of metals and organic substances, the pH should be shifted to the acid side by addition of an acid, so that the treatment liquid can have a high oxidation-reduction potential, metals can be ionized to be easily dissolved into the liquid, and organic substances can be easily decomposed by oxidation, which can increase cleaning efficiency. In addition, raising the concentration or temperature of the treatment liquid is effective in increasing the cleaning speed. Application of ultrasound or the like for the purpose of using ultrasound cavitation is also effective.

The radical water is suitable for use as a cleaning liquid for cleaning electronic components, semiconductor wafers for use in the process of manufacturing them, or other components (for oxidative removal of organic and inorganic substances) and also suitable as functional water for use in separation of photoresist films, oxidation of silicon substrate surfaces, etc. Hydroxyl radicals produced according to the invention are highly effective in selectively decomposing or removing organic substances, and therefore, the invention is particularly effective in peeling off photoresist films. Examples of photoresist films include resists for patterning in semiconductor manufacturing processes, resists for making photomasks for use in pattern transfer, resists or solder resists for forming patterns in circuit board manufacturing processes, and resists for printing plates.

More specific examples include I-ray resists containing novolac resin and diazonaphthoquinone or the like, KrF resists containing a polymer and a photo-acid generator or the like, to which a basic substance may be further added or into which an acetal side chain may be introduced, chemically amplified resists such as annealing type resists, ArF resists containing acrylic resin substituted for a benzene ring, which may have an adamantine group or any other alicyclic group introduced into the acrylic side chain or to which a 5β-steroid material may be added, resists produced with a copolymer of norbornene and maleic anhydride or the like, photosensitive polyimide, other photosensitive resins, and photosensitive thermosetting resins.

Chemically amplified resists are generally used in the production of photomasks for use in transfer processes. It is required not to cause any damage to a transfer pattern thin film containing chromium or the like or to an inorganic anti-reflection film provided on the surface thereof during the peeling off of the resists. As described above, hydroxyl radicals are highly effective in selectively decomposing or removing organic substances. It is therefore considered that the invention makes it possible to selectively peel off an organic substance-containing photoresist film without causing any damage to a transfer pattern thin film based on an inorganic material or to an anti-reflection film provided on the surface thereof.

Actually, an experiment was performed as in Experimental Example 2 described below, which included using a glass substrate on which a chromium-containing, light-blocking film and a chemically-amplified resist were formed, peeling off the resist, and determining an increase in the reflectance of the surface obtained after the resist was peeled off (relative to that of the untreated sample). As a result, at the same peel rate, a damage-induced increase in the reflectance of the surface was successfully reduced to half or less of the increase in the case where ozone water was used, over a wide wavelength range (250-500 nm).

Also, regardless of whether the contaminant is an organic substance or metal, the contaminant can be effectively removed using the radical water as a cleaning liquid as in the embodiments described above. Metal surfaces can also be oxidized using the radical water as an oxidizing liquid.

When the radical water is used as a cleaning liquid, the object to be cleaned (the object from which contaminants can be removed) is not restricted. For example, the object to be cleaned is preferably a precision part whose surface needs to be strictly clean, such as a semiconductor wafer, a device, or a liquid crystal substrate. This is because the radical water can effectively remove contaminants with no influence on the environment, the human body, or the object itself to be cleaned. Examples of the precision part include electronic components such as silicon wafers, printed circuit boards, glass substrates, liquid crystal substrates, magnetic disk substrates, and compound semiconductor substrates; and various components of apparatuses for manufacturing or cleaning such electronic components, such as filters for filtration, filter housings for filtration, pipes, wafer carriers, cleaning tanks, and pumps.

In an embodiment of the invention, before cleaning with the hydroxyl radial-containing water, pre-cleaning or pre-treatment such as physical or chemical surface treatment may be performed on the object to be cleaned. For example, when the object to be cleaned has hydrophobic surface properties, ultraviolet irradiation, plasma irradiation, or any other pre-treatment may be performed in advance so that efficient cleaning can be performed.

Although the detailed mechanism of the effect of removing contaminants with the radical water is not clear, it is considered that the effect of removing contaminants may be produced based on the action mechanism described below. Hydroxyl radicals have strong oxidizing properties and bactericidal activity. Therefore, hydroxyl radicals act to neutralize the charges of contaminants so that the neutralized contaminants can be dissociated from the surface of the object being cleaned and inhibited from being deposited on the surface again. For example, in the case of a metal, hydroxyl radicals take electrons from the metal to ionize it and to allow it to dissolve in the cleaning liquid.

When the radical water is used as a cleaning liquid, the radical water may be applied by any method to the object to be cleaned. For example, an immersion method may be used, in which the object to be cleaned is immersed in the radical water, or a spray method may be used, in which the radical water is sprayed from a shower on the object to be cleaned.

In recent years, for example, semiconductor wafer cleaning has been changing from batch cleaning, in which a plurality of wafers are subjected to immersion cleaning at a time, to piece-by-piece cleaning, in which a piece of wafer is cleaned while being rotated. The invention can be applied to piece-by-piece cleaning as well as batch cleaning, because high cleaning efficiency and high throughput can be expected. Piece-by-piece cleaning is preferably performed in combination with physical action using a two-fluid nozzle, an ultrasonic nozzle, a high-pressure nozzle, or the like so that the effect can be further increased.

The time of contact between the radical water and the object being cleaned cannot be universally defined, and may be determined as appropriate depending on the degree of fouling of the object to be cleaned, the method for applying the radical water, the desired degree of cleaning, and other factors.

The radical water is preferably brought into contact with the object to be cleaned, within 10 minutes, in particular, within 5 minutes after the addition of ozone, hydrogen peroxide, and the additive to pure water is completed in the process of producing it.

EXAMPLES

Hereinafter, the invention is described in more detail with reference to the Examples, which however are not intended to limit the invention.

Experimental Example 1

Examples 1 to 4 and Comparative Examples 1 to 6

Radical water was produced using the radical water supply apparatus 10 shown in FIG. 1. Specifically, first, oxygen gas was supplied at 1 L/minute to an ozonizer (a silent discharge-type ozone generator manufactured by REGAL JOINT CO., LTD.) from an oxygen cylinder (not shown). Ozone gas produced in the ozonizer was supplied at 1 L/minute to an ozone dissolving apparatus (diffuser tube type). In the ozone dissolving apparatus, 2 L of ultrapure water (18 MΩ·cm in electrical resistivity), which was supplied from an ultrapure water production apparatus, was constantly stored, and the ozone gas was blown into the ultrapure water through a diffuser tube to form ozone water. While the ozone water 1 prepared in the ozone dissolving apparatus was transferred at 1 L/minute through the pipe 11, the aqueous additive solution 20 with a concentration of 1,000 ppm was added at a predetermined flow rate from the aqueous additive solution storage tank 2 to the ozone water 1 by a pump, and the aqueous hydrogen peroxide solution 30 with a concentration of 20,000 ppm was further added thereto at a predetermined flow rate from the aqueous hydrogen peroxide solution storage tank 3 by a pump, so that radical water 4 was obtained. Immediately after the production, the hydroxyl radical concentration of the radical water 4 was measured by the method according to JIS R 1704:2007. Specifically, the radical water, of which the hydroxyl radical concentration was measured immediately after the production, was used immediately 0.5 seconds after the aqueous hydrogen peroxide solution 30 was finally added in the production process. The concentrations of ozone, hydrogen peroxide, and the additive determined are shown in Table 1. Before the additive was added, the ozone water was sampled and immediately used in the measurement of the ozone concentration. The concentration of the additive was determined as the ratio of the added amount of the additive to the total amount of the radical water, based on the concentration of the aqueous additive solution 20. The concentration of hydrogen peroxide was determined as the ratio of the added amount of hydrogen peroxide to the total amount of the radical water, based on the concentration of the aqueous hydrogen peroxide solution 30. The additive used was iso-propanol.

The dissolved amount of ozone in the ozone dissolving apparatus, the flow rate of addition of the aqueous additive solution 20, and the flow rate of addition of the aqueous hydrogen peroxide solution 30 were appropriately controlled so that the concentrations of ozone, hydrogen peroxide, and the additive in the radical water were set to the values shown in Table 1. An ozone concentration of 0 ppm means that ozone gas was not blown or dissolved into ultrapure water. A hydrogen peroxide concentration of 0 ppm means that the aqueous hydrogen peroxide solution 30 was not added. An additive concentration of 0 ppm means that the aqueous additive solution 20 was not added.

Figure 2:
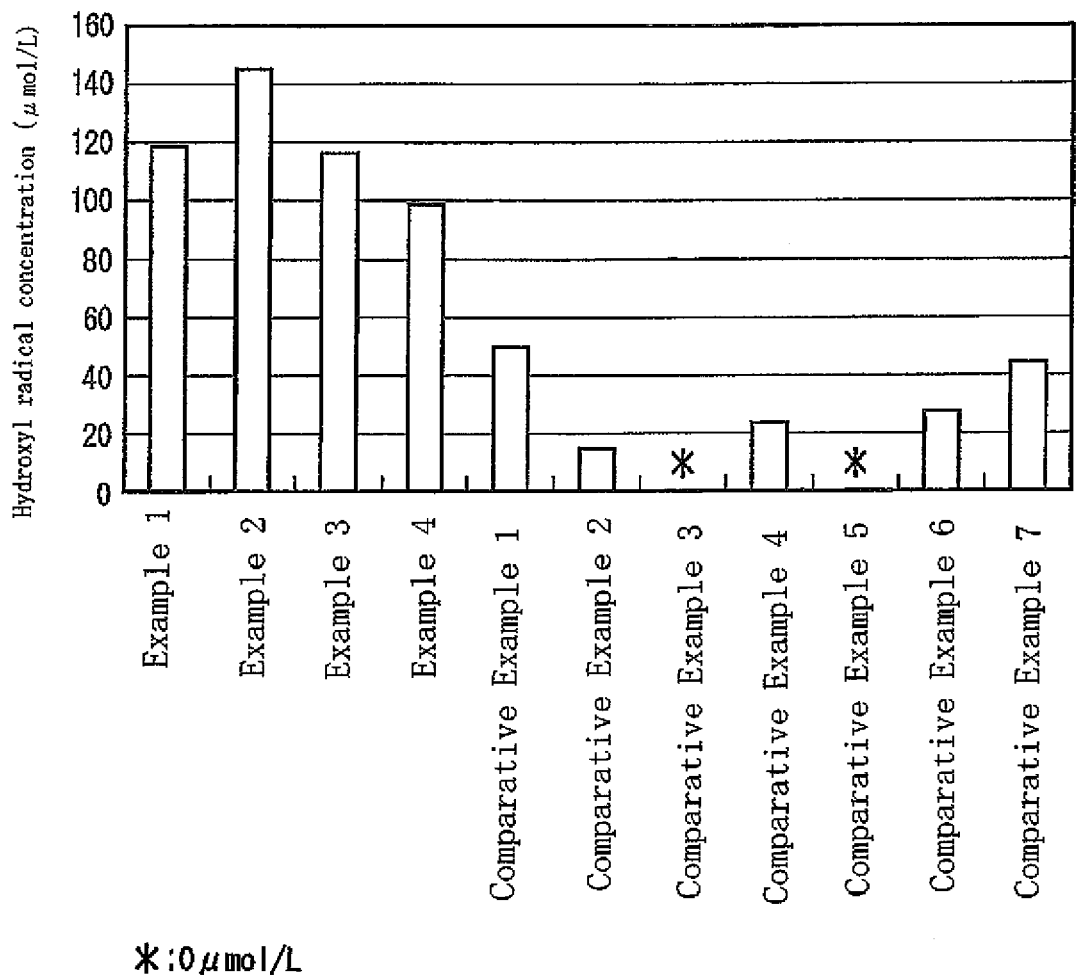
FIG. 2 is a graph showing the results of the measurement of the hydroxyl radical concentration in Experimental Example 1.

The results of the measurement of the hydroxyl radical concentration are shown in FIG. 2.

Comparative Example 7

The same experiment was performed as in Example 1, except that ultraviolet irradiation was performed in place of the addition of hydrogen peroxide. Ultraviolet irradiation was performed at 0.3 W for 20 seconds using a low-pressure mercury lamp SUV-40 (manufactured by SEN LIGHTS CORPORATION). The hydroxyl radical concentration was measured as in Example 1, and the measurement result is shown in FIG. 2. The measured value was 44 µmol/L.

TABLE 1

|  | Ozone concentration (PPM) | Hydrogen peroxide concentration (PPM) | Isopropanol concentration (PPM) |
|---|---|---|---|
| Example 1 | 90 | 50 | 10 |
| Example 2 | 91 | 100 | 10 |
| Example 3 | 90 | 150 | 10 |
| Example 4 | 92 | 200 | 10 |
| Comparative Example 1 | 92 | 1 | 0 |
| Comparative Example 2 | 85 | 50 | 0 |
| Comparative Example 3 | 0 | 0 | 0 |
| Comparative Example 4 | 100 | 0 | 0 |
| Comparative Example 5 | 0 | 50 | 10 |
| Comparative Example 6 | 89 | 0 | 10 |
| Comparative Example 7 | 85 | 0 | 10 |

Experimental Example 2

An object to be cleaned was immersed in the radical water for 60 seconds, 120 seconds, or 240 seconds immediately after the radical water was produced in each of Example 1 and Comparative Example 2 in Experimental Example 1, and the effect of removing contaminants from the surface of the object was evaluated by measuring the thickness of a resist. A silicon wafer (0.6 mm in thickness, 6 inches in size) coated with a 1 µm resist (positive I-ray resist) was used as the object to be cleaned. The thickness of the resist was calculated from the transmitted light absorbance obtained using an absorptiometer (Magna 50 manufactured by Nicolet). Specifically, the wafer uncoated with the resist was registered as a reference (background) in the absorptiometer, the absorbance of only the resist was measured, and the absorbance of the initial state (the wafer coated with the resist but not treated with the radical water) was also measured. Subsequently, the absorbance of the wafer treated with the radical water was measured, and the thickness of the resist was calculated from the ratio of the resulting absorbance to the absorbance of the initial state.

The results are shown in Table 2. The thickness of the resist showed almost no change even after 240 second immersion in the radical water of Comparative Example 2 not containing the additive, whereas about half of the resist was successfully peeled off by 240 second immersion in the radical water of Example 1 containing the additive.

TABLE 2

|  |  | Treatment time (seconds) | | | |
| --- | --- | --- | --- | --- | --- |
|  |  | 0 | 60 | 120 | 240 |
| Resist thickness (μm) | Example 1 | 1.00 | 0.88 | 0.82 | 0.55 |
|  | Example 2 | 1.00 | 1.00 | 0.99 | 0.98 |

Experimental Example 3

Examples 5 and 6 and Comparative Examples 8 to 10

In Experimental Example 3, the same experiment was performed as in Experimental Example 1, except that the concentrations of ozone, hydrogen peroxide, and the additive in the radical water were adjusted to the values shown in Table 3.

The results of the measurement of the hydroxyl radical concentration are shown in Table 4.

TABLE 3

|  | Ozone concentration (PPM) | Hydrogen peroxide concentration (PPM) | Additive | |
| --- | --- | --- | --- | --- |
|  |  |  | Carbon dioxide concentration (PPM) | Isopropanol concentration (PPM) |
| Example 5 | 10 | 10 | 1 | 0 |
| Example 6 | 10 | 10 | 0 | 2 |
| Comparative Example 8 | 10 | 0 | 0 | 0 |
| Comparative Example 9 | 10 | 10 | 0 | 0 |
| Comparative Example 10 | 10 | 0 | 1 | 0 |

TABLE 4

|  | Hydroxyl radical concentration (μmol/L) |
| --- | --- |
| Example 5 | 9.052 |
| Example 6 | 6.988 |
| Comparative Example 8 | 0.104 |
| Comparative Example 9 | 0.104 |
| Comparative Example 10 | 0.000 |

(Results)

The hydroxyl radical concentration was the highest in Example 5 where the concentration ratio (weight ratio) between ozone, hydrogen peroxide, and carbonic acid was 10:10:1. In contrast, the hydroxyl radical concentration was almost zero in each of Comparative Examples 8 to 10 where at least one of ozone, hydrogen peroxide, and the additive was not added.

Experimental Example 4

Example 7 and Comparative Examples 11 to 13

In Experimental Example 4, the concentrations of ozone, hydrogen peroxide, and the additive in the radical water were first adjusted to the values shown in Table 5. Subsequently, the adjusted radical water was allowed to stay, and the hydroxyl radical concentration was measured 0.5 seconds, 30 seconds, 60 seconds, 180 seconds, or 300 seconds after the adjustment.

The results of the measurement of the hydroxyl radical concentration are shown in Table 6 and FIG. 3.

TABLE 5

|  | Ozone concentration (PPM) | Hydrogen peroxide concentration (PPM) | Isopropanol concentration (PPM) |
| --- | --- | --- | --- |
| Example 7 | 94 | 100 | 20 |
| Comparative Example 11 | 94 | 0 | 0 |
| Comparative Example 12 | 94 | 0 | 10 |
| Comparative Example 13 | 94 | 100 | 0 |

TABLE 6

|  | Hydroxyl radical concentration (μmol/L) | | | |
| --- | --- | --- | --- | --- |
| Residence time (seconds) | Example 7 | Comparative Example 11 | Comparative Example 12 | Comparative Example 13 |
| 0.5 | 121.4 | 8.0 | 34.5 | 0.0 |
| 30 | 98.8 | 4.0 | 0.0 | 0.0 |
| 60 | 79.4 | 2.9 | 0.0 | 0.0 |
| 180 | 54.0 | 2.7 | 0.0 | 0.0 |
| 300 | 24.6 | 0.6 | 0.0 | 0.0 |

(Results)

In Example 7 where ozone, hydrogen peroxide, and the additive were added, a high concentration of hydroxyl radicals were obtained immediately after the adjustment, and a high concentration of about 25 μm/L was maintained even after 180 seconds.

In Comparative Examples 11 to 13 where one of hydrogen peroxide and the additive was not added, however, a high concentration of hydroxyl radicals were not obtained, and the concentration was reduced to 14 μm/L or less after 180 seconds.

DESCRIPTION OF REFERENCE CHARACTERS

In the drawings, reference character 1 represents ozone water, 2 an aqueous additive solution storage tank, 3 an aqueous hydrogen peroxide solution storage tank, 4 radical water (hydroxyl radical-containing water), 10 a hydroxyl radical-containing water supply apparatus (radical water supply apparatus), 11 a pipe, 12 a valve, 15 a transfer pipe, 16 a supply unit, 17 a hydroxyl radical concentration meter, 20 an aqueous additive solution, 30 an aqueous hydrogen peroxide solution, 50 a cleaning tank, and P1 and P2 each a pump.

The invention claimed is:

1. An apparatus for supplying hydroxyl radical-containing water, comprising:
   production means for producing hydroxyl radical-containing water by dissolving ozone, hydrogen peroxide, and at least one additive selected from the group consisting of a water-soluble organic substance, an inorganic acid, a salt of the inorganic acid, and hydrazine in pure water in a weight ratio of the hydrogen peroxide to the ozone of not less than 10/10;
   transfer means for transferring the produced hydroxyl radical-containing water to a point of use; and supply means for supplying the transferred hydroxyl radical-containing water at the point of use.

2. A method for supplying hydroxyl radical-containing water from the apparatus according to claim 1, comprising:
- a production step comprising dissolving the ozone, the hydrogen peroxide, and the at least one additive selected from the group consisting of a water-soluble organic substance, an inorganic acid, a salt of the inorganic acid, and hydrazine in pure water to produce hydroxyl radical-containing water;
- a transfer step comprising transferring the produced hydroxyl radical-containing water to a point of use; and
- a supply step comprising supplying the transferred hydroxyl radical-containing water at the point of use.

3. A method for supplying hydroxyl radical-containing water from the apparatus comprising:
- production means for producing hydroxyl radical-containing water by dissolving ozone, hydrogen peroxide, and at least one additive selected from the group consisting of a water-soluble organic substance, an inorganic acid, a salt of the inorganic acid, and hydrazine in pure water;
- transfer means for transferring the produced hydroxyl radical-containing water to a point of use; and
- supply means for supplying the transferred hydroxyl radical-containing water at the point of use, comprising:
- a production step comprising dissolving the ozone, the hydrogen peroxide, and the at least one additive selected from the group consisting of a water-soluble organic substance, an inorganic acid, a salt of the inorganic acid, and hydrazine in pure water to produce hydroxyl radical-containing water;
- a transfer step comprising transferrin the produced hydroxyl radical-containing water to the point of use; and
- a supply step comprising hydroxyl radical-containing water at the point of use;
- wherein in the production step, ozone, hydrogen peroxide, and the additive are dissolved in a weight ratio of ozone/hydrogen peroxide/the additive of 10-40/10-40/1-4 to form the hydroxyl radical-containing water.

4. The method according to claim 2, wherein the additive is dissolved at 1 to 100 ppm.

5. The method according to claim 2, wherein the additive is a water-soluble organic substance, and the water-soluble organic substance has an ozone reaction rate constant of 10 L/mol/sec or less.

6. The method according to claim 5, wherein the water-soluble organic substance is isopropanol.

7. The method according to claim 2, wherein the additive is carbonic acid as the inorganic acid.

8. The method according to claim 2, wherein pure water is ultrapure water with an electrical resistivity of 17 MΩ·cm or more.

9. The method according to claim 2, wherein in the supply step, the hydroxyl radical-containing water is supplied as a cleaning liquid for an electronic component or as a cleaning liquid in a process of manufacturing an electronic component.

10. An apparatus, for supplying hydroxyl radical-containing water, comprising:
- production means for producing hydroxyl radical-containing water by dissolving ozone, hydrogen peroxide, and at least one additive selected from the group consisting of a water-soluble organic substance, an inorganic acid, a salt of the inorganic acid, and hydrazine in pure water;
- transfer means for transferring the produced hydroxyl radical-containing water to a point of use; and
- supply means for supplying the transferred hydroxyl radical-containing water at the point of use
- wherein the production means dissolves ozone, hydrogen peroxide, and the additive in a weight ratio of ozone/hydrogen peroxide/the additive of 10-40/10-40/1-4.

11. The apparatus according to claim 1, wherein the production means dissolves the additive at 1 to 100 ppm.

12. The apparatus according to claim 1, wherein the additive is a water-soluble organic substance, and the water-soluble organic substance has an ozone reaction rate constant of 10 L/mol/sec or less.

13. The apparatus according to claim 12, wherein the water-soluble organic substance is isopropanol.

14. The apparatus according to claim 1, wherein the additive is carbonic acid as the inorganic acid.

15. The apparatus according to claim 1, wherein pure water is ultrapure water with an electrical resistivity of 17 MΩ·cm or more.

16. The apparatus according to claim 1, wherein the supply means supplies the hydroxyl radical-containing water as a cleaning liquid for an electronic component or as a cleaning liquid in a process of manufacturing an electronic component.

* * * * *

UNITED STATES PATENT AND TRADEMARK OFFICE
CERTIFICATE OF CORRECTION

PATENT NO.        : 8,715,420 B2
APPLICATION NO.   : 13/376165
DATED             : May 6, 2014
INVENTOR(S)       : Tadaharu Tanaka Page 1 of 1

It is certified that error appears in the above-identified patent and that said Letters Patent is hereby corrected as shown below:

On the Title Page: Item (73), change assignee city "Okyama" to --Okayama--.

Signed and Sealed this
Second Day of September, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,715,420 B2
APPLICATION NO. : 13/376165
DATED : May 6, 2014
INVENTOR(S) : Tadaharu Tanaka It is certified that error appears in the above-identified patent and that said Letters Patent is hereby corrected as shown below:

In the Specification

In column 2 at line 65, Change "axe" to --are--.

In column 7 at line 9 (approx.), Change "$HO_2^-$." to --$HO_2^-$--.

In column 7 at line 35, Change "$O_3$—." to --$O_3^-$.--.

In column 11 at line 41, Change "adamantine" to --adamantane--.

In the Claims

In column 17 at line 31, In Claim 3, change "transferrin" to --transferring--.

In column 17 at line 34, In Claim 3, after "comprising" insert --supplying the transferred--.

Signed and Sealed this
Twenty-first Day of July, 2015

Michelle K. Lee
*Director of the United States Patent and Trademark Office*